(12) United States Patent
Sasaski et al.

(10) Patent No.: US 8,353,986 B2
(45) Date of Patent: Jan. 15, 2013

(54) SUBSTRATE PROCESSING APPARATUS

(75) Inventors: Yoshiaki Sasaski, Nirasaki (JP); Yusuke Muraki, Nirasaki (JP); Eiichi Nishimura, Nirasaki (JP); Yuko Ono, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1203 days.

(21) Appl. No.: 11/391,390

(22) Filed: Mar. 29, 2006

(65) Prior Publication Data

US 2006/0219171 A1 Oct. 5, 2006

Related U.S. Application Data

(60) Provisional application No. 60/666,701, filed on Mar. 31, 2005.

(30) Foreign Application Priority Data

Mar. 31, 2005 (JP) .................................. 2005-100584

(51) Int. Cl.
C23F 1/00 (2006.01)
C23C 16/00 (2006.01)
H01L 21/306 (2006.01)

(52) U.S. Cl. ................ 118/719; 156/345.31; 156/345.32

(58) Field of Classification Search ............. 156/345.31, 156/345.32

See application file for complete search history.

(56) References Cited

U.S. PATENT DOCUMENTS

| | | | | | |
|---|---|---|---|---|---|
| 5,693,362 | A | * | 12/1997 | Boos et al. | 427/10 |
| 5,772,738 | A | * | 6/1998 | Muraoka | 96/129 |
| 6,033,301 | A | * | 3/2000 | Suwa | 454/187 |
| 6,473,151 | B1 | * | 10/2002 | Deguchi | 355/27 |
| 2002/0068524 | A1 | * | 6/2002 | Nakagawa | 454/187 |
| 2003/0219977 | A1 | * | 11/2003 | Pomarede et al. | 438/680 |
| 2004/0187786 | A1 | * | 9/2004 | Tanaka et al. | 118/719 |
| 2005/0016454 | A1 | * | 1/2005 | Kurita et al. | 118/719 |
| 2007/0101688 | A1 | * | 5/2007 | Wootton et al. | 55/385.2 |

FOREIGN PATENT DOCUMENTS

| | | |
|---|---|---|
| JP | 06-224144 | 8/1994 |
| JP | 11-63604 | 3/1999 |
| JP | 11-314703 | 11/1999 |
| JP | 2000-188320 | 7/2000 |
| JP | 2000-346417 | 12/2000 |
| JP | 2001-015578 | 1/2001 |
| JP | 2001-358197 | 12/2001 |
| JP | 2003-249536 | 9/2003 |
| JP | 2004-7014 | 1/2004 |
| JP | 2004-165239 | 6/2004 |

OTHER PUBLICATIONS

JP 2000-332002: Sakamoto, Akihisa; Nov. 30, 2000 (Translation).*
JP 2003-249535: Yoshida et al.; Sep. 5, 2003 (Translation).*
Kanzawa, K, et al., "A semiconductor device manufacturer's efforts for controlling and evaluating atmospheric pollution," Advanced Semiconductor Manufacturing Conference and Workshop, 1995, ASMC 95 Proceedings, IEEE/SEMI 1995, Nov. 13-15, 1995, pp. 190-193.

* cited by examiner

*Primary Examiner* — Parviz Hassanzadeh
*Assistant Examiner* — Nathan K Ford
(74) *Attorney, Agent, or Firm* — Oblon, Spivak, McClelland, Maier & Neustadt, L.L.P.

(57) ABSTRACT

In a substrate processing apparatus comprising a processing unit where a specific type of processing is executed on a wafer and a transfer chamber through which a wafer is carried into/out of the processing unit, the transfer chamber includes an air intake unit through which external air is drawn into the transfer chamber, a discharge unit disposed so as to face opposite the air intake unit, through which the discharge gas in the transfer chamber is discharged and a discharge gas filtering means disposed at the discharge unit and constituted with a harmful constituent eliminating filter through which a harmful constituent contained in the discharge gas, at least, is eliminated.

22 Claims, 8 Drawing Sheets

SUBSTRATE PROCESSING APPARATUS

CROSS REFERENCE TO RELATED APPLICATIONS

This document claims priority to Japanese Patent Application No. 2005-100584, filed Mar. 31, 2005 and U.S. Provisional Application No. 60/666,701, filed Mar. 31, 2005, the entire contents of which are hereby incorporated by reference.

FIELD OF THE INVENTION

The present invention relates to a substrate processing apparatus that includes a transfer chamber, a loadlock chamber and the like that take in and discharge external (room) air.

BACKGROUND OF THE INVENTION

A substrate processing apparatus that executes a specific type of processing such as etching or film formation on a substrate such as a glass substrate (e.g., a liquid crystal substrate) or a semiconductor wafer (hereafter may be simply referred to as a "wafer") includes a processing unit achieved by connecting a loadlock chamber two a processing chamber where a wafer, for instance, undergoes the specific type of processing and a transfer chamber through which a wafer is transferred (carried) into/out of the processing unit via a transfer mechanism such as a transfer arm.

In the transfer chamber, an unprocessed wafer stored in a cassette container is taken out and transferred over to the processing unit via the transfer mechanism. The unprocessed wafer is then carried into the processing chamber via the loadlock chamber and undergoes wafer processing in the processing chamber. Once the processing in the processing chamber ends, the processed wafer is carried back into the loadlock chamber from the processing chamber. The processed wafer having been returned to the loadlock chamber is transferred into the transfer chamber via the transfer mechanism which then takes it back into the cassette container.

In order to prevent particles (e.g., dust, dirt, deposits and reaction products) from settling on the wafer and thus ensure that the yield is kept at a desired level in the substrate processing apparatus, an air intake fan for taking in external air through an air intake port and a discharge port are respectively disposed on the upper side and on the lower side of a transfer chamber through which a wafer is transferred through external air. As external air is taken in through the air intake port by driving the air intake fan and is discharged through the discharge port, a specific gas flow (e.g., an air down flow) directed from the upper space toward the lower space inside the transfer chamber is created. Since the substrate processing apparatus is normally installed inside a clean room, the air within the clean room is taken into the transfer chamber and is then returned from the transfer chamber to the clean room.

However, the processed wafer carried back into the transfer chamber for retrieval may bear a processing gas constituent settled thereupon. In such a case, the gas constituent will be discharged from the transfer chamber together with the air inside the transfer chamber into, for instance, a clean room, giving rise to the risk of clean room contamination, depending upon the type of gas constituent contained in the exhaust gas. For instance, if a corrosive gas such as a gas containing Cl or Br is used as the processing gas, air containing corrosive gas constituents, e.g., $Cl_2$, $Br_2$, HCl or HBr) will be discharged from the transfer chamber into the clean room and the equipment installed in the clean room may become corroded by the gas constituents.

As a solution, the discharge port of the transfer chamber may be connected to the plant discharge system (e.g., a decontaminating system, i.e., a gas scrubber) so as to direct all the discharge gas from the transfer chamber to the plant discharge system. However, this solution is bound to greatly increase the onus on the plant discharge system.

It is to be noted that a filter is installed on the air intake side of the substrate processing chamber or a clean room so as to disallow entry of particles and the like into the substrate processing apparatus or the clean room in the known art. For instance, patent reference literature 1 and non-patent reference literature 1 both teach a structure that includes a filter disposed on the air intake side (the upper side) of the entire clean room where a substrate processing apparatus and the like are installed or on the air intake side of a partitioned area within the clean room. Patent reference literature 2 discloses a structure having a filter installed on the air intake side (lateral side) of a vertically oriented heat treatment apparatus.

However, while filters are installed on the air intake side of the substrate processing apparatus and the clean room so as to disallow entry of particles and the like into the substrate processing apparatus and the clean room in the related art, no significant measures are taken on the discharge side. This means that the problems attributable to the gas discharge from the transfer chamber described above cannot be solved simply by adopting the filter in the related art installed on the air intake side of the transfer chamber of the substrate processing apparatus.

[Patent Reference Literature 1]
Japanese Laid Open Patent Publication No. 2001-015578
[Patent Reference Literature 2]
Japanese Laid Open Patent Publication No. H06-224144
[Non-Patent Reference Literature 1]
Kanzawa. K, Kitano. J, "A semiconductor device manufacturer's efforts for controlling and evaluating atmospheric pollution" (Advanced Semiconductor Manufacturing Conference and Workshop, 1995. ASMC 95 Proceedings. IEEE/SEMI 1995), 13-15 Nov. 1995, pp. 190-193

SUMMARY OF THE INVENTION

An object of the present invention, which has been completed by addressing the problems of the related art discussed above, is to provide a substrate processing apparatus that does not allow any gas constituents in the processing gas such as a corrosive gas having settled on a processed substrate to be discharged to the outside together with the discharge gas from a transfer chamber or the like and thus helps reduce the onus placed on a plant discharge system or the like.

The object described above is achieved in an aspect of the present invention by providing a substrate processing apparatus comprising a processing unit in which a specific type of processing is executed on a substrate and a transfer chamber through which the substrate is carried into/out of the processing unit. The transfer chamber in the substrate processing apparatus includes an air intake unit through which external air is drawn into the transfer chamber, a discharge unit disposed so as to face opposite the air intake unit, through which a discharge gas inside the transfer chamber is released and a discharge gas filtering means disposed at the discharge unit for filtering the discharge gas. The discharge gas filtering means may be constituted with a harmful constituent eliminating filter through which a harmful constituent in the discharge gas, at least, is eliminated. More specifically, the discharge gas filtering means may be constituted with a chemical filter or an activated charcoal filter.

In the substrate processing apparatus according to the present invention described above, if a processed substrate having taken on a constituent of the processing gas such as a corrosive gas, is carried into the transfer chamber, the processing gas constituent is first eliminated through the discharge gas filter before the discharge gas is released to the outside. Thus, the gas constituent is not released to the outside together with the discharge gas from the transfer chamber. In addition, once the gas constituent, having settled on the processed substrate and entered the transfer chamber, is eliminated from the discharge gas, the discharge gas from the transfer chamber can be directly released without having to be processed through, for instance, the plant discharge system. Thus, the onus placed on the plant discharge system can be greatly reduced.

It is to be noted that at the discharge unit, a discharge fan may be disposed at a position further downstream on the discharge gas side relative to the discharge gas filtering means. In such a case, the discharge fan, which is not exposed to any corrosive constituent in the discharge gas, does not need to be constituted of an anti-corrosive material.

It is desirable that the air intake unit in the substrate processing apparatus include an intake air filtering means for filtering the external air being drawn into the transfer chamber. Such an intake air filtering means should be constituted with an amine constituent eliminating filter through which at least amine constituents (ammonia, amines and the like) contained in the external air being drawn into the transfer chamber are eliminated. More specifically, the intake air filtering means may be a chemical filter or an activated charcoal filter.

The intake air filtering means disposed at the air intake unit eliminates any amine constituents (e.g., ammonia) contained in the external air drawn into the transfer chamber. Thus, even when the processed substrate bearing a gas constituent of the processing gas such as a corrosive gas settled thereupon is carried into the transfer chamber or the like, generation of particles on the substrate, which would result from a chemical reaction between the gas constituent and amine-type constituents, does not occur. By disposing such an intake air filtering means at the air intake unit in addition to the discharge gas filtering means disposed at the discharge unit, effective measures against the gas settled on the processed substrate and carried into the transfer chamber are assured.

It is to be noted that the intake air filtering means may include a particle eliminating filter for eliminating particles contained in the external air drawn into the transfer chamber in addition to the amine constituent eliminating filter. Such an intake air filtering means will prevent particles of dust, dirt and the like from entering the transfer chamber together with the external air.

The object described above is also achieved in another aspect of the present invention by providing a substrate processing apparatus comprising a processing unit in which a specific type of processing is executed on a substrate and a transfer chamber through which the substrate is carried into/out of the processing unit via a loadlock chamber. The loadlock chamber in the substrate processing apparatus includes an air intake unit through which external air is drawn into the loadlock chamber, an acid discharge unit that executes acid discharge in the loadlock chamber and a discharge gas filtering means disposed at the acid discharge unit for filtering the acid discharge gas. The discharge gas filtering means in the substrate processing apparatus includes a harmful constituent eliminating filter through which a harmful constituent contained in the discharge gas, at least, is eliminated.

In the substrate processing apparatus according to the present invention structured as described above, a harmful constituent such as a gas constituent of a corrosive gas can be eliminated from the discharge gas released via the acid discharge unit at the loadlock chamber. As a result, the discharge gas can be directly released without having to connect the acid discharge unit of the loadlock chamber to the plant discharge system, thereby reducing the onus placed on the plant discharge system.

An intake air filtering means for filtering the external air being drawn into the loadlock chamber may be disposed at the air intake unit of the loadlock chamber. Such an intake air filtering means should be constituted with an amine constituent eliminating filter through which at least amine constituents contained in the external air being drawn into the loadlock chamber are eliminated. The intake air filtering means disposed at the air intake unit eliminates any amine constituent contained in the external air drawn into the loadlock chamber. Thus, even when the processed substrate bearing a gas constituent of the processing gas such as a corrosive gas settled thereupon is carried into the transfer chamber or the like, generation of particles on the substrate, which would result from a chemical reaction between the gas constituent and amine-type constituents, does not occur.

The object described above is achieved in yet another aspect of the present invention by providing a substrate processing apparatus comprising a processing unit in which a specific type of processing is executed on a substrate and a transfer chamber through which the substrate is carried into/out of the processing unit. The substrate processing apparatus further includes a standby unit connected to the transfer chamber and constituted with a substrate standby chamber where a substrate having undergone processing in the processing unit is temporarily held in standby and a discharge unit that releases discharge gas in the substrate standby chamber, and a discharge gas filtering means disposed at the discharge unit of the standby unit for filtering an acid discharge gas. The discharge gas filtering means includes a harmful constituent eliminating filter through which a harmful constituent in the discharge gas, at least, is eliminated.

In the substrate processing apparatus according to the present invention structured as described above, a harmful constituent such as a gas constituent of a corrosive gas can be eliminated from the discharge gas released via the discharge unit of the standby unit. As a result, the discharge gas can be directly released without having to connect the discharge unit of the standby unit to the plant discharge system, thereby reducing the onus placed on the plant discharge system.

It is to be noted that a positioning device that positions the substrate may be connected to the transfer chamber and the standby unit may be disposed directly under the positioning device. This arrangement will improve the operational efficiency of the transfer mechanism that transfers the substrate inside the transfer chamber, which, in turn, will lead to an improvement in the throughput.

DETAILED DESCRIPTION OF PREFERRED EMBODIMENTS

Figure 1:
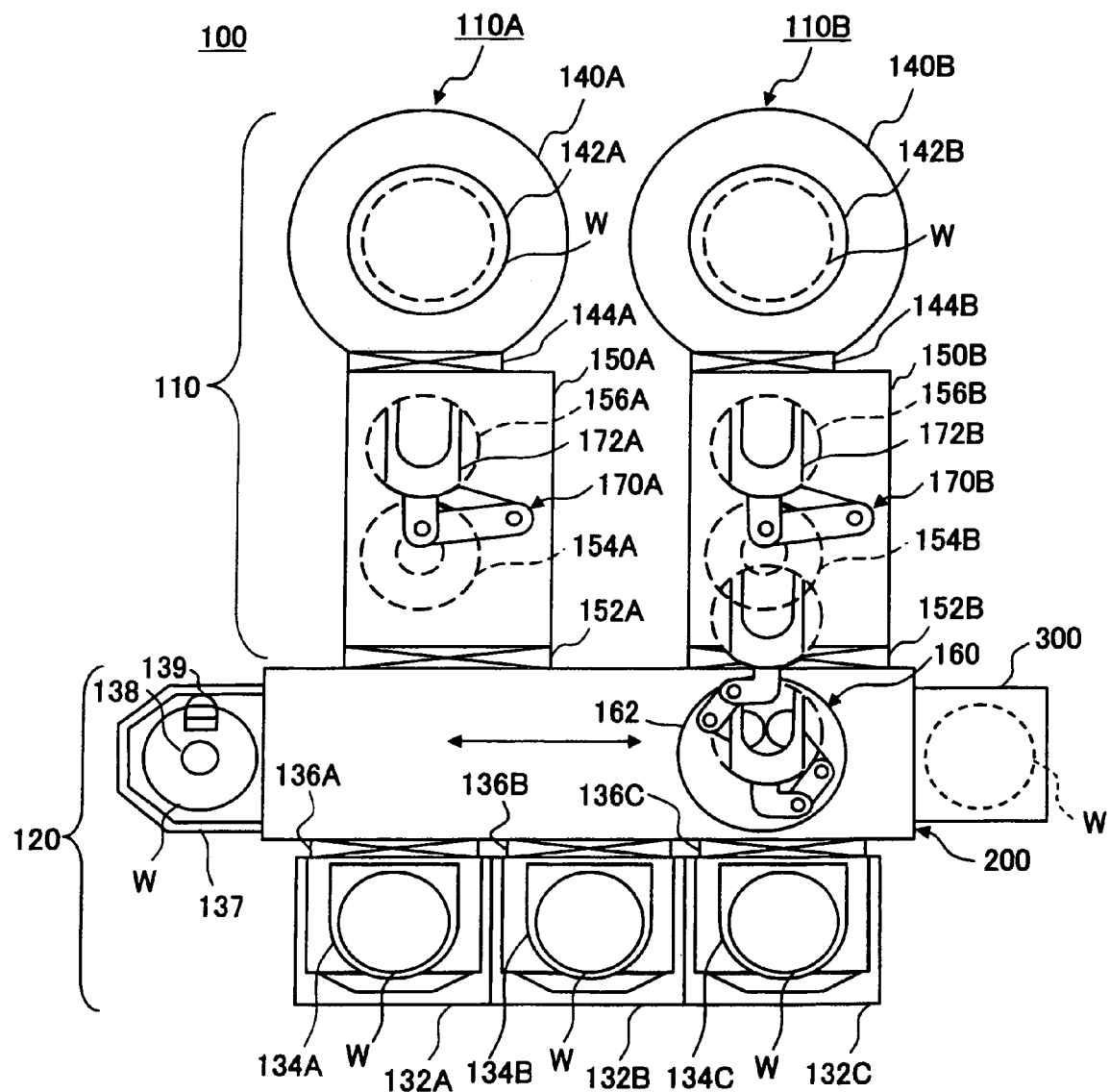
FIG. 1 is a sectional view presenting a structural example that may be adopted in the substrate processing apparatus achieved in an embodiment of the present invention.

The following is a detailed explanation of the preferred embodiments of the present invention, given in reference to the attached drawings. It is to be noted that in the specification and the drawings, the same reference numerals are assigned to constituents having substantially identical functions and structural features to preclude the necessity for a repeated explanation thereof.

(Structural Example for Substrate Processing Apparatus)

First, a structural example that may be adopted in the substrate processing apparatus in an embodiment of the present invention is explained in reference to a drawing. The substrate processing apparatus in this example includes at least one vacuum processing unit connected to a transfer chamber. FIG. 1 is a sectional view schematically illustrating the structure of the substrate processing apparatus achieved in the embodiment.

The substrate processing apparatus 100 includes either a single vacuum processing unit 110 or a plurality of vacuum processing units 110 where various types of processing such as film formation and etching are executed on a substrate, e.g., a semiconductor wafer (hereafter may be simply referred to as "wafer") W, in order to manufacture a semiconductor device, and a transfer unit 120 that transfers the semiconductor wafer W into/out of each vacuum processing unit 110. The transfer unit 120 includes a transfer chamber 200 used to transfer wafers W.

In the example presented in FIG. 1, two vacuum processing units 110A and 110B are disposed along a side surface of the transfer unit 120. The vacuum processing units 110A and 110B respectively include processing chambers 140A and 140B and evacuatable load-lock chambers 150A and 150B disposed continuous to the processing chambers. In the processing chambers 140A and 140B of the vacuum processing units 110A and 110B, a single type of processing or different types of processing can be executed on wafers W. Inside the processing chambers 140A and 140B, stages 142A and 142B on which wafers W can be placed are disposed. It is to be noted that the number of vacuum processing units 110, each comprising a processing chamber 140 and a load-lock chamber 150, is not limited to two, and additional vacuum processing units may be disposed.

The transfer chamber 200 at the transfer unit 120 is formed as a box with a substantially rectangular section, where an inert gas such as $N_2$ gas or clean air is circulated. A plurality of cassette tables 132A through 132C are disposed side-by-side at one of the side surfaces of the transfer chamber 200 ranging along the longer side of the substantially rectangular section. The cassette tables 132A through 132C function as substrate standby ports, at which cassette containers 134A through 134C are placed. While FIG. 1 shows three cassette containers 134A through 134C each placed on one of the cassette tables 132A through 132C, the numbers of the cassette tables and the cassette containers are not limited to this example and there may be one or two cassette tables and cassette containers, or there may be four or more cassette tables and cassette containers.

At each of the cassette containers 134A through 134C, up to 25 wafers W can be stored in multiple racks with equal pitches. The cassette containers assume a sealed structure with, for instance, an $N_2$ gas atmosphere filling the space therein. Wafers W can be carried into/out of the transfer chamber 200 via gate valves 136A through 136C.

A common transfer mechanism (atmospheric pressure-side transfer mechanism) 160 that transfers a wafer W along the length (along the direction indicated by the arrow in FIG. 1) thereof is disposed inside the transfer chamber 200. The common transfer mechanism 160 is fixed onto, for instance, a base 162 and the base 162 is allowed to slide on a guide rail (not shown) disposed over the central area of the transfer chamber 200 so as to extend along the length thereof via, for instance, a linear motor drive mechanism. The common transfer mechanism 160 may be a double-arm mechanism equipped with two end-effectors, as shown in FIG. 1, or it may be a single-arm mechanism equipped with a single end-effector.

At the other side surface of the transfer chamber ranging along the longer side of the substantially rectangular section, the base ends of the two load-lock chambers 150A and 150B are connected via switchable gate valves (atmospheric pressure-side gate valves) 152A and 152B. The front ends of the load-lock chambers 150A and 150B are respectively connected to the processing chambers 140A and 140B via switchable gate valves (vacuum pressure-side gate valves) 144A and 144B.

In the load-lock chambers 150A and 150B, a pair of buffer stages 154A and 156A and a pair of buffer stages 154B and 156B, on which wafers W are temporarily held in standby, are respectively disposed. In the explanation, the buffer stages 154A and 154B disposed closer to the transfer chamber are referred to as first buffer stages, whereas the buffer stages 156A and 156B disposed on the other side are referred to as second buffer stages. Individual transfer mechanisms (vacuum pressure-side transfer mechanisms) 170A and 170B, each constituted with an articulated arm capable of articulating, rotating and moving up/down, are disposed respectively between the buffer stages 154A and 156A and between the buffer stages 154B and 156B.

At the front ends of the individual transfer mechanisms 170A and 170B, end-effectors 172A and 172B are respectively disposed, so that wafers W can be transferred between the first and second buffer stages 154A and 156A and between the first and second buffer stages 154B and 156B via the end-effectors 172A and 172B respectively. It is to be noted that wafers are carried from the load-lock chambers 150A and 150B to the processing chambers 140A and 140B and vice versa via the respective individual transfer mechanisms 170A and 170B.

At one end of the transfer chamber 200, i.e., at one of the side surfaces ranging along the shorter side of the substantially rectangular section of the transfer chamber 200, an orienter (pre-alignment stage) 137 engaged in operation when positioning the wafer W is disposed. The orienter 137, which includes a rotary stage 138 and an optical sensor 139 for optically detecting the circumferential edge of the wafer W, positions the wafer W by detecting an orientation flat, a notch or the like at the wafer W.

At the other end of the transfer chamber 200, i.e., at the other side surface ranging along the shorter side of the substantially rectangular section of the transfer chamber 200, and acid discharge unit 300 to function as a standby unit is disposed. The acid discharge unit 300 holds a processed wafer W in standby until the processed wafer W no longer releases a gas attributable to a processing gas constituent having settled (having become adhered) onto the processed wafer W. The structure adopted in the acid discharge unit 300 is to be detailed later.

It is to be noted that while the acid discharge unit 300 is disposed at the end on the side opposite from the orienter 137 in the structure adopted in the substrate processing apparatus in FIG. 1, the present invention is not limited to this example in the acid discharge unit 300 may instead be disposed at an end on the same side as the orienter 137, i.e., at the one end of the transfer chamber 200. In such a case, the acid discharge unit should be disposed directly under the orienter 137.

The structural arrangement described above allows the common transfer mechanism 160, having carried a processed wafer W out of, for instance, a loadlock chamber, to assume a specific position at the one end of the transfer chamber 200 to carry a processed wafer W into the acid discharge unit 300 and also carry an unprocessed wafer W out of the orienter 137. As a result, better operational efficiency is achieved for the common transfer mechanism 160 and the throughput is improved.

A wafer W to undergo wafer processing in the substrate processing apparatus structured as described above is taken out of a cassette container among the cassette containers 134A through 134C via the common transfer mechanism 160. The wafer W having been taken out of the cassette container by the common transfer mechanism 160 is then carried into the orienter 137 where it is set on the rotary stage 138 and is positioned. The positioned wafer W is transferred back to the common transfer mechanism 160 and is held at the common transfer mechanism 160 until it is carried to a position immediately in front of the loadlock chamber 150A or 150B in the vacuum processing unit 110A or 110B where the wafer W is to undergo the processing. As the gate valve 152A or 152B opens, the wafer W held on the common transfer mechanism 160 is transferred from the transfer chamber 200 into the loadlock chamber 150A or 150B. Once the wafer W is in the loadlock chamber 150A or 150B, the gate valve 152A or 152B closes.

As the gate valves 144A or 144B opens, the wafer W having been carried into the loadlock chamber 150A or 150B is taken into the processing chamber 140A or 140B via the individual transfer mechanism 170A or 170B. After the wafer W is carried into the processing chamber 140A or 140B, the corresponding gate valve 144A or 144B closes, and a specific type of processing such as etching is executed on the wafer W in the processing chamber 140A or 140B by using, for instance, a corrosive gas as the processing gas.

As the gate valve 144A or 144B opens upon the completion of processing on the wafer W in the processing chamber 140A or 140B, the wafer W is carried into the loadlock chamber 150A or 150B via the individual transfer mechanism 170A or 170B. After the wafer W is carried into the loadlock chamber 150A or 150B, the gate valve 144A or 144B closes and an operation to transfer the wafer W into the transfer chamber 200 is executed. Namely, in order to eliminate the pressure difference between the transfer chamber 200 under atmospheric pressure conditions and the pressure in the loadlock chamber 150A or 150B, the pressure in the loadlock chamber 150A or 150B is adjusted to one atmosphere and then the gate valve 152A or 152B is opened. Then, the wafer W is returned to the transfer chamber 200 from the loadlock chamber 150A or 150B via the common transfer mechanism 160 and the gate valve 152A or 152B closes.

(Measures Taken with Regard to Gas Constituents Settled on Processed Wafer)

Immediately after undergoing the wafer processing, the processed wafer W bearing gas constituents of the processing gas settled thereupon may be carried back into the transfer chamber 200 via the loadlock chamber 150 from the processing chamber 140. The gas settled on the processed wafer W in this manner may cause the following problems.

For instance, if the processed wafer W bearing a gas constituent settled thereupon is carried into the transfer chamber 200, the gas constituent of the processing gas settled on the processed wafer W enters the transfer chamber 200 together with the processed wafer W, resulting in the gas constituent becoming mixed in the discharge gas from the transfer chamber 200. For instance, if a corrosive gas containing Cl, Br or the like is used as the processing gas and the air within the transfer chamber 200 is directly released to the outside, the harmful constituents, i.e., the gas constituents (e.g., $Cl_2$, $Br_2$, HCl or HBr), too, may be released to the outside.

Accordingly, a discharge gas filtering means for eliminating the gas constituent (e.g., $Cl_2$, $Br_2$, HCl or HBr) constituting the processing gas containing Cl or Br is disposed on the discharge side of the transfer chamber 200 in the present invention so as to release the discharge gas from the transfer chamber 200 via the discharge gas filtering means. Since the gas constituent in the discharge gas from the transfer chamber 200 is eliminated via the discharge gas filtering means in this structure, the discharge gas released to the outside (e.g., the clean room where the substrate processing apparatus 100 is installed) of the transfer chamber 200 does not contain the gas constituent of the gas containing Cl, Br or the like.

In addition, the processing gas constituents (e.g., halogen-base gas constituents of a gas containing, for instance, F, Br or Cl) having settled on the processed wafer W immediately after the processing may chemically bond with the surface of the processed wafer W and form a compound. The formation of such a compound on the processed wafer W may lead to generation of particles (reaction products) on the processed wafer W, depending upon constituents contained in the atmosphere surrounding the processed wafer W.

In reference to a drawing, generation of particles on a processed wafer W caused by the constituent of the processing gas having settled on the processed wafer W, is explained. FIG. 2 illustrates the process through which particles are generated on the processed wafer W.

Figure 2A:
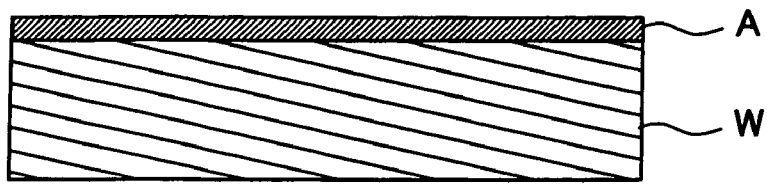
FIGS. 2A, 2B, 2C and 2D illustrate how particles may be generated on a processed wafer.

As shown in FIG. 2A, as the constituent of the processing gas having settled on the processed wafer W chemically bonds with the surface of the processed wafer W, a compound A is formed. For instance, if the processing gas contains a halogen-base gas constituent (e.g., a constituent of a gas containing F, Cl, Br or the like), the gas constituent bonds with $SiO_2$ or the like at the processed wafer W, thereby forming the compound A on the processed wafer W.

Figure 2B:
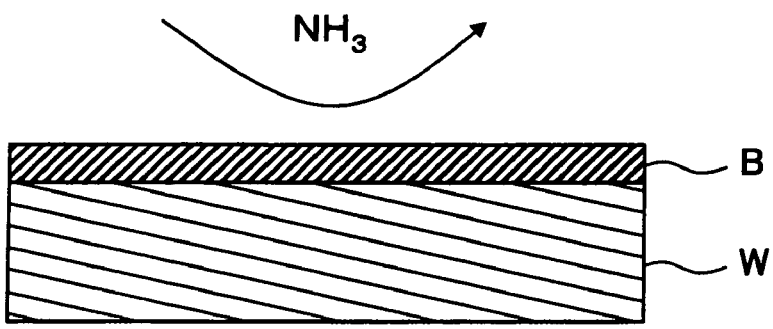
Figure 2C:
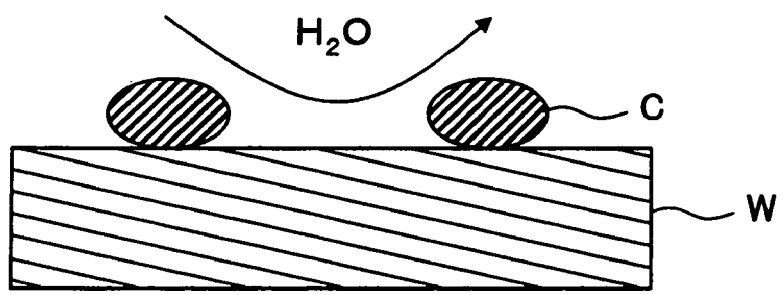

If, for instance, an amine constituent is contained in the ambient atmosphere of the processed wafer W, a reaction of the halogen-base compound A at the processing wafer W and the amine constituent in the atmosphere occurs and, as a result, salt (B) is formed on the surface of the processed wafer W, as shown in FIG. 2B. The amine constituent may be, for instance, ammonia or an amine. The amine may be trimethylamine, triethylamine or an organic base amine.

The sequence through which the salt (B) is formed at the surface of the processed wafer W can be indicated by using chemical expressions (1-1) through (1-3) below. The expressions represent the process through which the substance ($SiO_2$) constituting the surface of the processed wafer W becomes chemically bonded with a gas constituent (HF) of the processing gas, thereby forming a compound ($SiF_4$), reaction of the compound ($SiF_4$) and ammonia ($NH_3$) in the atmosphere occurs and halogen-base ammonia salt (e.g., $(NH_4)_2SiF_6$) is formed.

$$SiO_2 + 4HF \rightarrow SiF_4 + 2H_2O \qquad (1\text{-}1)$$

$$SiO_2 + 4HF + 4NH_3 \rightarrow SiF_4 + 2H_2O + 4NH_3 \qquad (1\text{-}2)$$

$$SiF_4 + 2HF + 2NH_3 \rightarrow (NH_4)_2SiF_6 \qquad (1\text{-}3)$$

The reaction represented in chemical expression (1-1) above is assumed to occur under normal circumstances, when the substance ($SiO_2$) constituting the surface of the processed wafer W becomes bonded with the gas constituent (HF) of the processing gas and a compound ($SiF_4$) is formed as a result.

However, if ammonia ($NH_3$) is present in the atmosphere, the reaction represented in chemical expression (1-2) may instead occur. While the reaction energy needed to induce the reaction to switch from the state on the left side to the state on the right side in chemical expression (1-1) is 1.0 eV, the reaction energy needed to induce the reaction to switch from the state on the left side to the state on the right side in chemical expression (1-2) is 0.4 eV, much lower than the level of reaction energy needed for the chemical reaction expressed in (1-1).

Accordingly, if ammonia ($NH_3$) is present in the atmosphere, the reaction represented in chemical expression (1-2) will occur more readily and thus, the compound ($SiF_4$) will be formed readily on the surface of the processed wafer W. This, in turn, will prompt the reaction represented in chemical expression (1-3), resulting in formation of halogen-base ammonia salt (($NH_4)_2SiF_6$).

Thus, as the processed wafer W bearing a halogen-base gas constituent settled thereupon is left in an atmosphere containing ammonia ($NH_3$), halogen-base ammonia salt (e.g., $(NH_4)_2SiF_6$) will be formed on the surface of the processed wafer W.

The salt B such as halogen-base ammonia salt formed on the surface of the processed wafer W gradually absorbs water ($H_2O$) contained in the atmosphere surrounding the processed wafer W. As time elapses, this leads to the generation of particles C shown in FIG. 2C. Namely, particles C with a particle size of approximately 0.001 μm, too small to be measured on an electron microscope, are initially generated, and the quantity and size of such particles C gradually increase over time. For instance, the particle size will increase to approximately 0.1 μm after an hour or so, and the particle size may even increase to 0.5 to 0.7 μm after 24 hours.

Figure 2D:
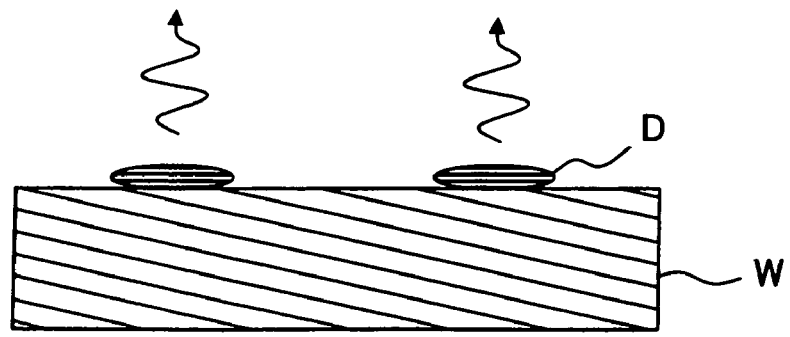

After a few days, a deliquescence of the salt B with the moisture ($H_2O$) in the atmosphere occurs, causing coagulation of the salt B. Under such circumstances, if $SiO_2$ is contained in the particles C, $SiO_2$ will be left as a residue D on the processed wafer W after the particles C evaporate, as shown in FIG. 2D. It is to be noted that if the particles C do not contain, for instance, $SiO_2$, the particles C will evaporate and disappear without leaving any residue.

FIG. 3 presents graphs, one indicating the relationship between the length of time the processed wafer W was left in the atmosphere and the number of particles generated on the processed wafer W, observed by leaving the processed wafer W having been, for instance, etched using a processing gas containing an F constituent in an atmosphere that did not contain any ammonia constituent and the other indicating the relationship observed by leaving the processed wafer W in an atmosphere containing an ammonium constituent.

Figure 3A:
FIGS. 3A and 3B show the relationship between the length of time over which the processed wafer is left untended and the number of particles generated on the processed wafer.
Figure 3B:
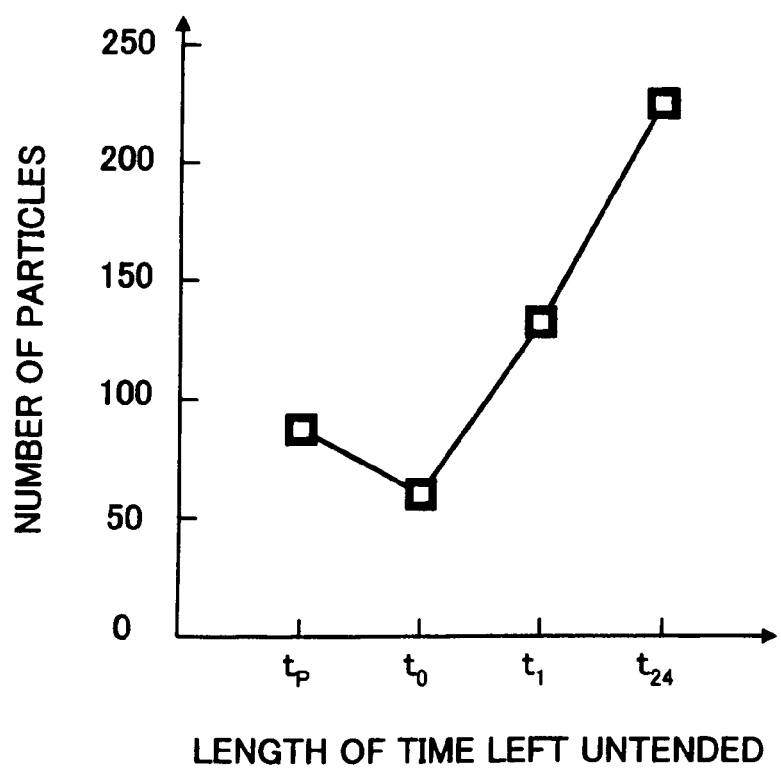

FIG. 3A shows the relationship observed by leaving the processed wafer W in an atmosphere that did not contain an ammonia constituent, whereas FIG. 3B shows the relationship observed by leaving the processed wafer W in an atmosphere that did contain an ammonia constituent. In FIG. 3, time is indicated on the horizontal axis and the number of particles is indicated along the vertical axis. The graphs in FIG. 3 indicate the numbers of particles at least 0.12 μm in size and detectable on the processed wafer W through an electron microscope, which were counted immediately before the processing at a time point $t_p$, immediately after the processing (0 hour after the processing) at a time point $t_0$, 1 hour after the processing at the time point $t_1$ and 24 hours after the processing at a time point $t_{24}$.

The test results in FIG. 3A indicate that the number of particles present on the processed wafer W remains largely unchanged over time when the processed wafer W is left in an atmosphere that does not contain any ammonia constituent. In contrast, the test results presented in FIG. 3B indicate that if the processed wafer W is left in an atmosphere containing an ammonia constituent, the number of particles present on the processed wafer W left in the atmosphere increases over time. It is to be noted that while an explanation is given above in reference to the test results on an example in which the processing gas used to process the wafer W contains an F constituent and ammonia salt (($NH_4)_2SiF_6$) is formed on the processed wafer W, particles are generated on the processed wafer W when the processing gas used to process the wafer W contains another halogen constituent (e.g., Br) since ammonia salt ((e.g., $(NH_4)_2SiBr_6$) is bound to be formed on the processed wafer W in a similar manner.

Depending upon the type of processing gas used in the wafer processing, a gas constituent (e.g., a constituent of a halogen-base gas such as F, Br or Cl) constituting the processing gas becomes bonded with the substance constituting the surface of the processed wafer W, thereby forming a compound immediately after the processing. The compound, in turn, reacts with an amine constituent such as ammonia contained in the atmosphere, resulting in formation of salt which eventually becomes salt particles. In other words, as the processed wafer W is simply left in the atmosphere containing an amine constituent such as ammonia immediately after the processing, generation of particles occurs. This gives rise to a concern that generation of particles on the processed wafer W, attributable to the atmosphere within the transfer chamber 200 may occur if external air containing an ammonia constituent is drawn into the transfer chamber 200 where the processed wafer W is present.

Such an ammonia constituent is released from the bodies of the operators working in the clean room as well. Thus, if the air in the clean room is directly drawn into the transfer chamber 200 as external air, which is bound to contain an ammonia constituent, particles are highly likely to be generated on the processed wafer W. While the ammonia constituent may be eliminated from the clean room by filtering the air in the entire clean room, such measures adopted to maintain the environment inside the clean room in a specific condition are bound to be extremely costly.

The cost performance issue is often addressed in recent years by maintaining only a specific areas such as inside the substrate processing apparatus in a highly clean state, as in mini-environment systems achieved through the use of, for instance, an SMIF (standard mechanical interface) instead of maintaining the entire plant or the entire clean room in a highly clean state.

However, while measures against particles of dust and dirt are taken through the localized cleaning technologies in state of the art plants where mini-environment systems equipped with SMIF are in place, no measures are taken in those plants against particles of the corrosive gas constituents described above, e.g., particles attributable to the ammonia constituent.

Accordingly, the present invention includes an intake air filtering means such as a chemical filter for eliminating an amine constituent such as ammonia, disposed at an intake port of the transfer chamber 200 so as to draw external air into the transfer chamber 200 via the intake air filtering means. The intake air filtering means eliminates the amine constituent contained in the air being drawn into the transfer chamber 200, and thus, generation of particles (e.g., particles of corrosive gas constituents such as particles attributable to an ammonia constituent) originating from the processing gas constituent settled on the processed wafer W is prevented.

As described above, by disposing a filtering means on the air intake side as well as on the discharge side of the transfer chamber 200, full measures are taken according to the present invention with regard to gas constituents that may settle on the processed wafer W.

(Structural Example for Transfer Chamber)

Figure 4:
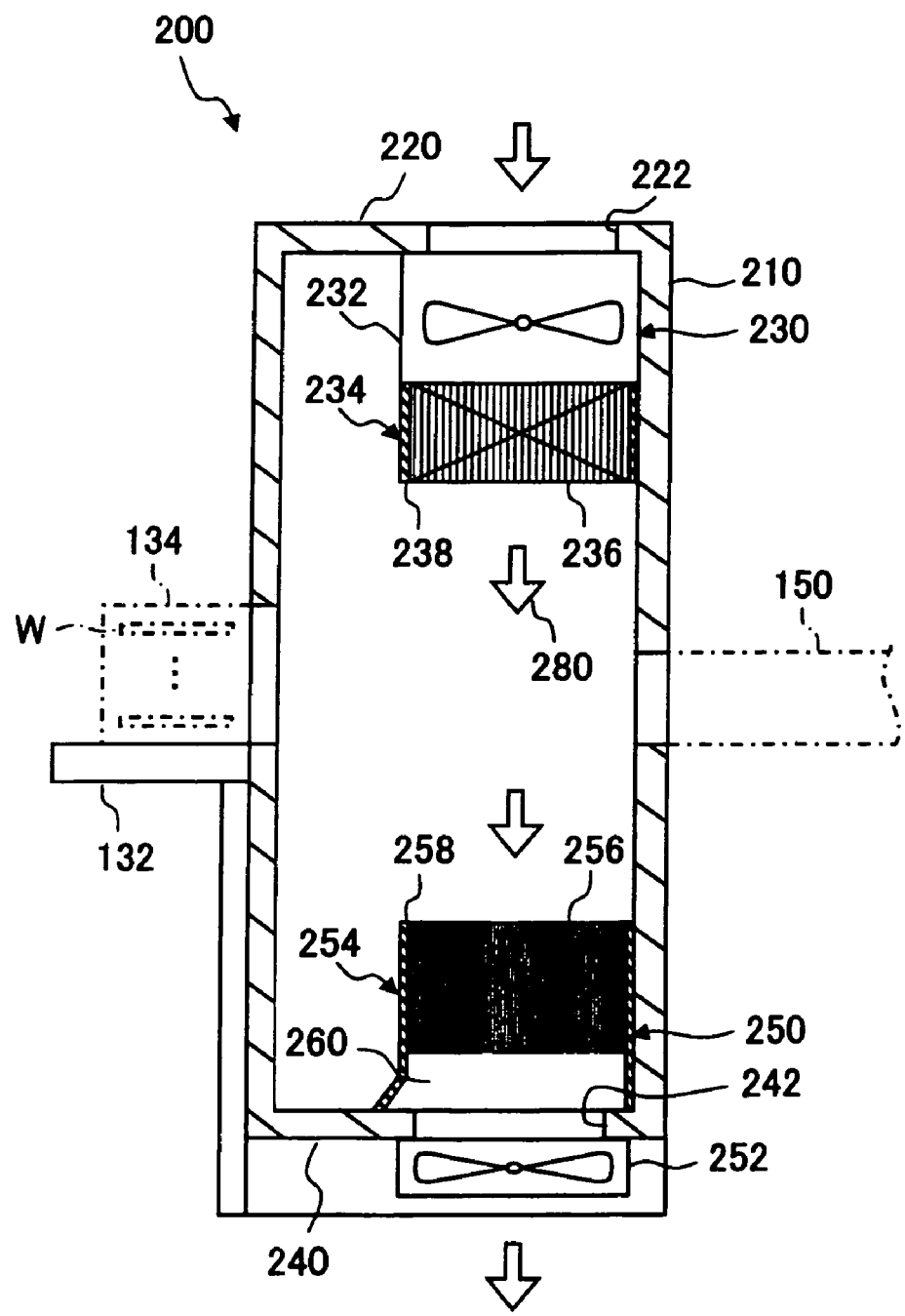
FIG. 4 is a sectional view schematically illustrating the structure adopted in the transfer chamber, viewed from an end of the transfer chamber.
Figure 5:
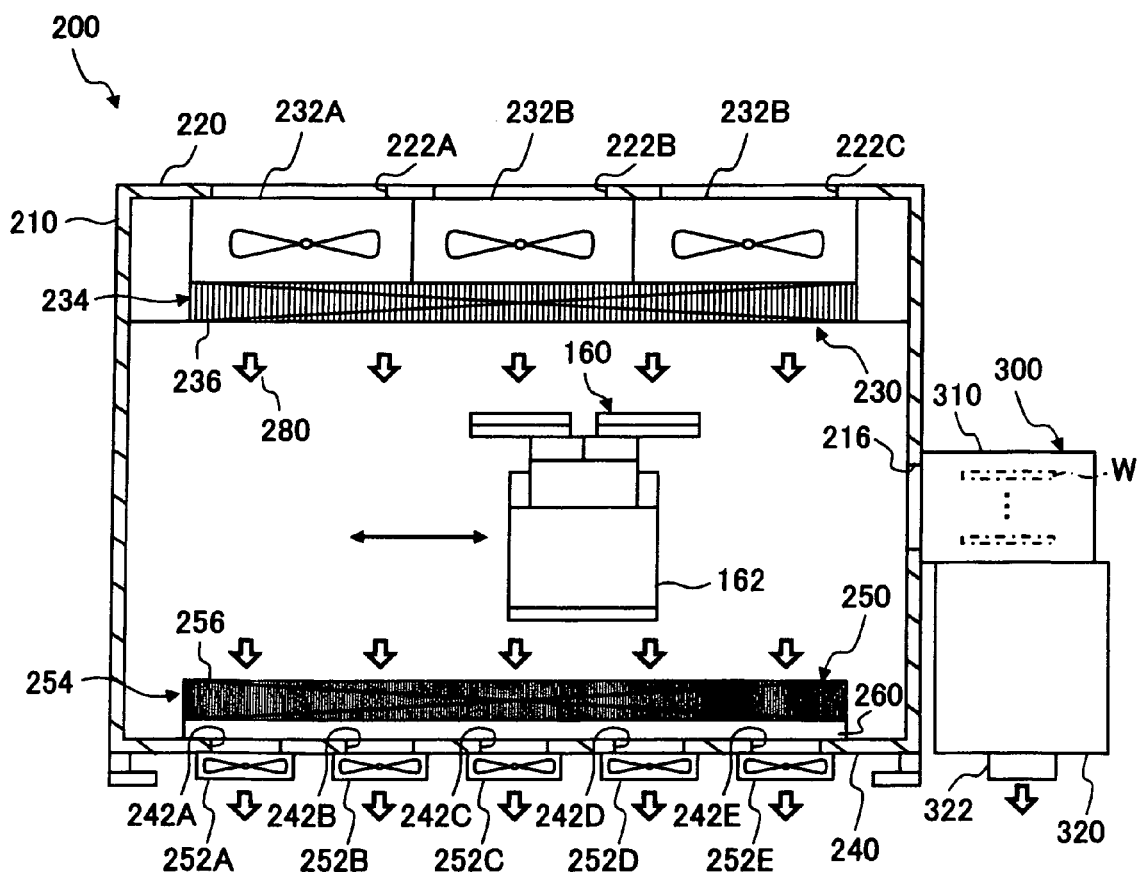
FIG. 5 is a sectional view schematically illustrating the structure adopted in the transfer chamber, viewed from a side surface of the transfer chamber 200 along the lengthwise direction.

Next, an example of a structure that may be adopted in the transfer chamber in the embodiment of the present invention is explained in reference to drawings. FIGS. 4 and 5 are sectional views each schematically showing the structure of the transfer chamber 200 achieved in the embodiment. FIG. 4 presents a view of a section of the transfer chamber 200 taken from an end thereof, whereas FIG. 5 presents a view of a section of the transfer chamber 200 taken from a side surface (on the side toward the cassette table 132) along the lengthwise direction. It is to be noted that FIG. 4 does not include the common transfer mechanism 160 in the illustration and that FIG. 5 does not include the orienter 137 in the illustration.

As shown in the figures, the transfer chamber 200 is defined by the casing 210 constituted of, for instance, stainless steel or aluminum. An air intake unit 230 through which air is drawn into the transfer chamber 200 is disposed at a ceiling (top) 220 of the casing 210, whereas a discharge unit 250 through which air (external air) having been drawn in through the air intake unit 230 is discharged to the outside of the transfer chamber 200 is disposed at a bottom (lower portion) 240 of the casing 210. With the air intake unit 230 and the discharge unit 250 disposed so as to face opposite each other, an air down flow 280 directed toward the bottom (lower portion) 240 from the ceiling (top) 220 is created inside the transfer chamber 200. The following is a detailed explanation of the structures adopted in the air intake unit 230 and the discharge unit 250.

The air intake unit 230 is first explained. The air intake unit 230 includes an intake fan 232 that draws in air from an air intake port 222 formed at the ceiling (top) 220 of the casing 210 and an intake air filtering means 234 for filtering the air drawn in from the air intake port 222 by the intake fan 232.

More specifically, a plurality of air intake ports 222 (222A through 222C) are formed at the ceiling (top) 220 of the casing 210 over substantially equal intervals along the length thereof. Directly under these air intake ports 222 (222A through 222C), a plurality of intake fans 232 (232A through 232C) are disposed. In addition, directly under the intake fans 232 (232A through 232C), the intake air filtering means 234 is disposed.

The intake air filtering means 234 may be constituted with, for instance, an intake air filter 236 and a frame member 238 that detachably holds the intake air filter 236. It is to be noted that the intake air filtering means 234 may be constituted by detachably mounting the intake air filter 236 onto the casing 210 or the like.

The intake air filter 236 is constituted with an amine constituent eliminating filter through which an amine constituent contained in the air being drawn in through the air intake ports 222 (222A through 222C) is eliminated. The amine constituent as referred to in this context may be, for instance, ammonia or an amine. The amine may be, for instance, trimethylamine, triethylamine or an organic base amine. The intake air filter 236 may be constituted with, for instance, a chemical filter or an activated charcoal filter.

It is to be noted that the intake air filtering means 234 may adopt a two-stage structure that includes the amine constituent eliminating filter described above and a particle eliminating filter through which particles of dirt, dust and the like contained in the external air being drawn into the transfer chamber 200 are eliminated. Such a structure prevents dust and dirt particles from entering the transfer chamber 200 together with the external air. The particle eliminating filter may be, for instance, a ULPA (ultra low penetration air) filter.

The discharge unit 250 includes a discharge fan 252 that blows air out through a discharge port 242 formed at the bottom (lower portion) 240 of the casing 210 and a discharge gas filtering means 254 for filtering the air being discharged through the discharge port 242 by the discharge fan 252.

More specifically, a plurality of air discharge ports 242 (242A through 242E) are formed at the bottom 240 of the casing 210 over a substantially equal intervals along the length thereof. Directly under these discharge ports 242 (242A through 242E), a plurality of discharge fans 252 (252A through 252E) are disposed. In addition, the discharge gas filtering means 254 is disposed above the discharge ports 242 (242A through 242E) so as to cover the discharge ports 242 (242A through 242E).

The discharge fans 252 (252A through 252E) may be each constituted with a DC fan, the rotation rate of which can be controlled through rotation control achieved by a DC (direct current) motor. By adjusting the air velocity achieved via the individual discharge fans 252 (252A through 252E), a linear air down flow 280 is created inside the transfer chamber 200. If the down flow 280 created inside the transfer chamber 200 becomes tilted and thus the flow is disrupted, particles may fly up to settle onto the wafer W being transferred on the common transfer mechanism 160 inside the transfer chamber 200. Accordingly, the air down flow 280 is adjusted to achieve linearity to prevent particles from becoming lifted upward in the embodiment.

In addition, while the discharge unit in FIG. 5 includes five discharge fans 252 (252A through 252E), four or fewer discharge fans or six or more discharge fans may be provided instead. By disposing a plurality of discharge fans 252 along the length of the transfer chamber 200, fine adjustment of the air down flow 280 along the length of the transfer chamber 200 is enabled.

It is to be noted that while the intake fans 232 are included in the air intake unit 230 and the discharge fans 252 are included in the discharge unit 250 in the embodiment, either the intake fans 232 or the discharge fans 252 alone may be provided. As long as either the intake fans 232 or the discharge fans 252 are provided, a flow of the air taken into the transfer chamber 200 from the outside and discharged from the transfer chamber 200, e.g., the down flow 280, can be created.

However, if the intake fans 232 alone are provided, the air down flow 280 may become disrupted as the air travels downward inside the transfer chamber 200. For this reason, the structure achieved in the embodiment also includes the discharge fans 252 disposed at the discharge unit 250 to create a negative pressure at the bottom as well and thus achieve better linearity for the air down flow 280.

Furthermore, the discharge fans 252 are disposed under the discharge gas filtering means 254 at the discharge unit 250 in FIG. 5 and thus, air having passed through the discharge gas filtering means 254 where a gas constituent (e.g., $Cl_2$, $Br_2$, HCl or HBr) of the gas containing Cl or Br is eliminated, then passes through the discharge fans 252. This means that the discharge fans 252, which are not exposed to the corrosive constituent in the discharge gas do not need to be constituted of an anti-corrosive material. As a result, inexpensive discharge fans 252 can be utilized. However, the structure of the discharge unit 250 is not limited to the example described above and the discharge fans 252 may be disposed above the discharge gas filtering means 254. In such a case, the discharge fans 252 should be constituted of an anticorrosive material.

The discharge gas filtering means 254 may be constituted with, for instance, discharge gas filters 256 and a frame member 258 that detachably holds the discharge gas filter 256. The discharge gas filters 256 are held by the frame member 258 with an open space 280 formed under the discharge gas filter 256. With the discharge filters 256 (256A and 256B) disposed with a clearance created by the space 260 between the discharge fans 252 (252A through 252E) and the discharge gas filters, the air is allowed to enter over the entire surfaces of the discharge gas filters 256 substantially evenly.

In addition, the frame member 258 at the discharge gas filtering means 254 may include an opening formed at one and or both ends thereof so as to allow the discharge gas filters 256 to be slidably attached/detached through the opening along the lengthwise direction. Since this allows the discharge gas filters 256 to be attached/detached at the frame member 258 with ease, the filter replacement operation is facilitated.

Such a discharge gas filtering means may include a plurality of separate discharge gas filters 256. Since small discharge gas filters 256 can slide through the discharge gas filtering means 254 for installation or removal with greater ease, the replacement operation is further facilitated. Furthermore, the size of the space inside the casing 210 that is needed to accommodate the removal of the discharge gas filters 256 from the discharge gas filtering means 254 does not need to be large when there is a greater number of discharge gas filters 256. The discharge gas filtering means may include any number of discharge gas filters 256. However, if there are too many discharge gas filters 256, a replacement operation becomes more complicated.

Accordingly, it is desirable to dispose an optimal number of discharge gas filters 256, e.g., two discharge gas filters, by taking into consideration the size of available space inside the transfer chamber 200 and the optimal replacement procedure. It is to be noted that the discharge gas filtering means 254 may be constituted by detachably mounting the discharge gas filters 256 directly onto the casing 210 or the like, instead.

Furthermore, a ladder may be installed above the discharge gas filtering means 254 so as to provide footing for an operator entering the transfer chamber 200 for purposes of maintenance or the like.

The discharge gas filters 256 may each be constituted with a harmful constituent eliminating filter through which harmful constituents contained in the air being discharged via the discharge ports 242 (242A through 242E) can be eliminated. Such a harmful constituent may be a gas constituent (e.g., $Cl_2$, $Br_2$, HCl, HBr or the like) of a corrosive gas containing Cl or Br.

The discharge gas filters 256 may be chemical filters that chemically absorb and eliminate the harmful constituent (e.g., HCl, HBr or the like) contained in the discharge gas by neutralizing the harmful substances with carbonate. Chemical expressions (2-1) and (2-2) below indicate the processes through which harmful constituents HCl and HBr are eliminated with such a chemical filter.

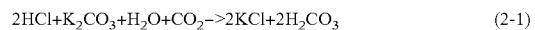
$$2HCl+K_2CO_3+H_2O+CO_2 \rightarrow 2KCl+2H_2CO_3 \quad (2\text{-}1)$$

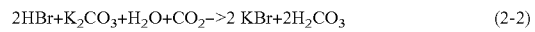
$$2HBr+K_2CO_3+H_2O+CO_2 \rightarrow 2\ KBr+2H_2CO_3 \quad (2\text{-}2)$$

HCl or HBr contained in the air passing through the chemical filter are eliminated as they become transformed into salt such as potassium chloride (KCl) and potassium bromide (KBr) through the reactions expressed in (2-1) and (2-2) above and are held at the surface of the chemical filter. It is to be noted that once the salt such as potassium chloride and potassium bromide is caught at the chemical filter, it remains there unless a specific level of energy is applied by, for instance, applying a specific amount of heat.

The structure that may be adopted in the chemical filter described above is now explained in reference to a drawing. FIG. 6 provides conceptual diagrams illustrating structures that may be adopted in the chemical filter in partial top views. As shown in FIG. 6, the chemical filter adopts a honeycomb structure. As air travels from the top side toward the bottom side of the chemical filter, harmful substances such as a gas constituent of the gas containing, for instance, Cl or Br, which is contained in the air, becomes caught at the side surfaces of the individual constituents constituting the honeycomb structure and as the chemical reaction (e.g., neutralization achieved with a carbonate) explained above is induced, the harmful constituent such as HCl or HBr is eliminated from the air.

The harmful constituent eliminating capability of the chemical filter increases in proportion to the area of the surfaces of the individual constituents constituting the honeycomb structure, i.e., the area of the surfaces coming into contact with the air. Thus, the eliminating capability of the chemical filter increases in proportion to the height of the chemical filter and the thickness of the chemical filter since the surface area increases in proportion to the height and thickness of the chemical filter.

Figure 6A:
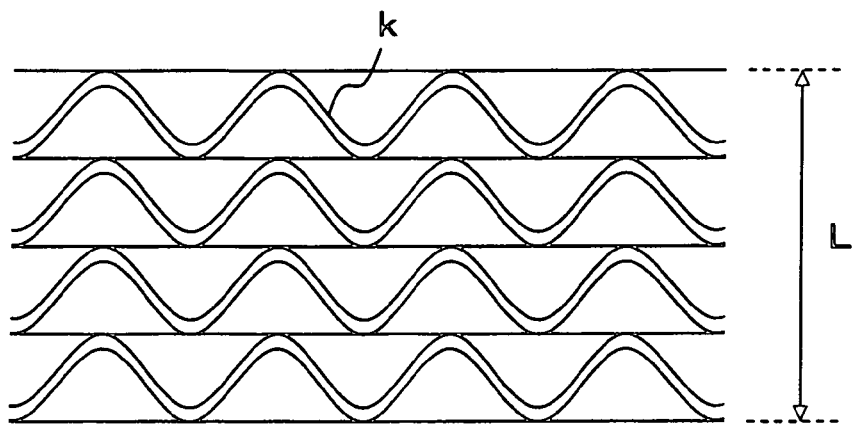
FIG. 6A is a conceptual diagram illustrating the structure of a chemical filter in a partial view from above.
Figure 6B:
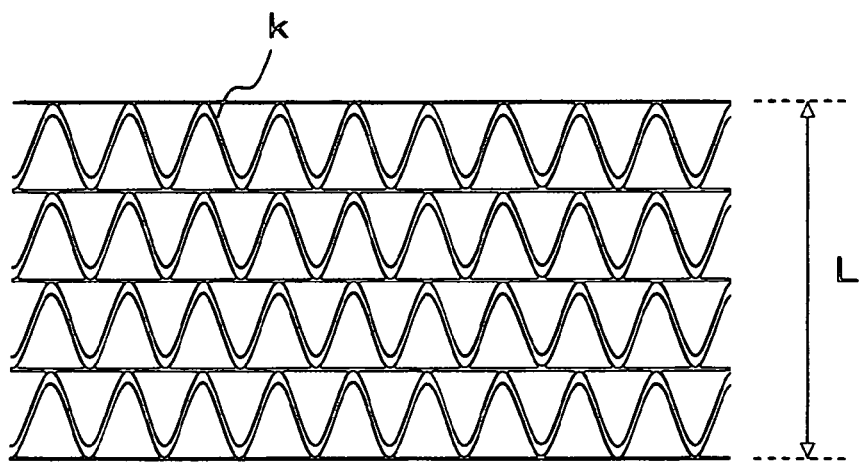
FIG. 6B is a conceptual diagram illustrating the structure of a chemical filter in a partial view from above.

The height and the thickness of the installation space where the discharge gas filtering means 254 is disposed inside the transfer chamber 200 are restricted. In order to maximize the harmful constituent eliminating capability (the elimination efficiency) of the discharge gas filtering means disposed in such a limited installation space, the overall area of the surfaces may be maximized by reducing the wavelength of the waves formed with the individual constituents in the honeycomb structure adopted in the chemical filter. FIGS. 6A and 6B are enlarged views of chemical filters taken over a given thickness L. The wavelength of the waves formed with the individual constituents k in the honeycomb structure in FIG. 6B is smaller than that shown in FIG. 6A. By reducing the wavelength of the waves formed with the constituents k constituting the honeycomb structure in this manner, the overall area of the surfaces over a given thickness is increased, which, in turn, makes it possible to improve the harmful constituent eliminating capability.

The replacement timing with which the discharge filters 256 at the discharge gas filtering means 254 should be replaced, determined based upon their durability measured through, for instance, testing, should be stored in advance in memory or the like included in a control unit of the substrate processing apparatus 100. Then, the control unit may measure the length of time over which the discharge gas filters 256 have been in use, and when the discharge gas filters are due for replacement, processing such as bringing up a display prompting replacement at a display unit of the control unit may be executed.

A service life sensor for detecting the service life of the discharge gas filters 256 may be mounted at the discharge gas filtering means 254. In such a case, as the service life sensor, monitored by the control unit, detects that the discharge gas filters 254 are nearing the end of their service life, the control unit may execute processing for bringing up a display prompting filter replacement at the display unit of the control unit. Such a service life sensor may be a sensor that detects the quantity of a gas constituent such as HCl or HBr contained in the air inside the transfer chamber 200. Alternatively, a silica gel detection sheet or the like, the color of which changes in correspondence to the quantity of the gas constituent such as HCl may be attached to the discharge gas filtering means 254 to function as a service life sensor and the color of the silica gel detection sheet may be visually monitored by the operator.

As shown in FIG. 4, a transfer port 212 through which a wafer W is carried into/out of the transfer chamber 200 from/to a cassette container 134 set on a cassette table 132 and a transfer port 214 through which a wafer W is carried into/out of the transfer chamber from/to a loadlock chamber 150 are formed at the casing 210 defining the transfer chamber 200. At the transfer ports 212 and 214, the gate valves 136 and 152 mentioned earlier are respectively disposed so as to allow the transfer chamber to be opened/closed freely while assuring a high level of airtightness. FIG. 4 does not include illustration of the gate valves 136 and 152.

In addition, a transfer port 216, through which a wafer W is carried into/out of the transfer chamber 200 from/to the acid discharge unit 300 to function as a standby unit is formed at the casing 210 defining the transfer chamber 200, as shown in FIG. 5. The acid discharge unit 300 includes a substrate standby chamber 310 where a processed wafer W having been carried in from the transfer chamber 200 is temporarily held and an acid discharge unit 320 that discharges a discharge gas from the substrate standby chamber 310.

The substrate standby chamber 310 adopts a structure that allows a plurality of (e.g., 19) wafers to be held over multiple racks. For instance, the substrate standby chamber 310 may include installed therein a base plate, a plurality of (e.g., 4) substrate holding posts fixed to the base plate and having formed thereat holding grooves over multiple levels (e.g., so as to hold up to 19 wafers) at which wafers are held at the edges, and heater rods disposed inside the substrate holding posts to function as heat application members.

A discharge pipe 322 at the acid discharge unit 320 is connected to a plant discharge system (e.g., a clean room decontamination system) at the plant where the substrate processing apparatus 100 is installed. A pressure difference sensor and a variable valve for controlling the discharge are disposed at the acid discharge unit 320. By controlling the displacement via the variable valve at the acid discharge unit 320, the displacement achieved at the acid discharge unit 320 can be adjusted in coordination with the discharging power available in the plant discharge system at the plant where the substrate processing apparatus 100 is installed.

A processed wafer W having been moved back by the common transfer mechanism 160 to the transfer chamber 200 from the processing unit 110 is carried into the substrate standby chamber 310 of the acid discharge unit 300, to be temporarily held therein before it is carried back into the cassette container 134. The processed wafer W in the substrate standby chamber is held at the substrate holding posts, heated to a predetermined temperature by the heater rods and is held in standby until a predetermined length of time elapses. Through this process, the processing gas constituent having settled on the processed wafer W is released from the processed wafer W.

The acid discharge unit 320, a suction force with which the discharge gas is released from the substrate standby chamber 310 is generated with the discharge suction force imparted from the plant discharge system connected with the discharge pipe 322. Thus, even if the gas constituent (e.g., HCl or HBr) is released from the processed wafer W held inside the substrate standby chamber 310, the gas is discharged to the plant discharge system via the acid discharge unit 320.

Subsequently, when a predetermined length of time has elapsed, the processed wafer W is taken out of the substrate standby chamber 310 by, for instance, the common transfer mechanism 160, which then carries the wafer back into the cassette container 134. Thus, the processed wafer W is not taken back into the cassette container 134 while still bearing the gas constituent settled thereupon and, as a result, the interior of the cassette container 134 and other wafers W stored in the cassette container 134 do not become contaminated by the gas constituent of a corrosive gas on the processed wafer W.

(Example of Operation in the Transfer Chamber)

Next, an example of operation that may be executed in the transfer chamber 200 structured as described above is explained. As the substrate processing apparatus 100 is engaged in operation, the individual intake fans 232 (232A through 232C) at the air intake unit 230 and the individual discharge fans 252 (252A through 252E) at the discharge unit 250 are all driven in the transfer chamber 200. Thus, the air drawn in from the outside is drawn into the transfer chamber 200 via the air intake ports 222 (222A through 222C) and the air having been drawn in is then forcibly released to the outside through the discharge ports 242 (242A through 242E). As a result, the air down flow 280 directed from the air intake unit 230 to the discharge unit 250, i.e., from the ceiling (top) 220 of the casing 210 toward the bottom (lower portion) 240, is created inside the transfer chamber 200.

The air from the outside (e.g., from the clean room where the substrate processing apparatus 100 is installed) is drawn into the casing 210 via the intake air filtering means 234 at the air intake unit 230. Thus, even if the air in the clean room contains an amine constituent such as ammonia, the amine constituent is eliminated via the intake air filtering means 234 and air that is free of the amine constituent is then drawn into the transfer chamber 200.

No amine constituent is thus present in the atmosphere within the transfer chamber 200. As a result, when a processed wafer W having been processed in a processing chamber is carried back on the common transfer mechanism 160 from, for instance, a loadlock chamber 560 to the transfer chamber 200, no particles attributable to a processing gas constituent having settled on the processed wafer are generated.

The air drawn into the transfer chamber 200 from, for instance, the clean room, is discharged via the discharge gas filtering means 254 at the discharge unit 250 and flows back into the clean room. Thus, even if the processing gas containing a harmful constituent such as a Cl or Br gas constituent enters the transfer chamber 200 on the processed wafer W carried back into the transfer chamber 200 from, for instance, a loadlock chamber 560 on the common transfer mechanism 160, the harmful constituent is eliminated through the discharge gas filtering means 254 and the air devoid of the harmful constituent is then released to the outside of the transfer chamber 200. In other words, the air from the transfer chamber 200, still containing the harmful constituent, is not released into the clean room.

(Comparison with Transfer Chamber from which Discharge Gas is Discharged Via Acid Discharge Unit)

The discharge gas from the transfer chamber 200 may be conceivably released to the plant discharge system (e.g., a clean room decontamination system) exclusively via the acid discharge unit 320 of the acid discharge unit 300 included in the substrate processing apparatus 100. In this case, the discharge gas from the transfer chamber 200 is directed to the plant discharge system instead of being released into the clean room, as in the embodiment.

Figure 7:
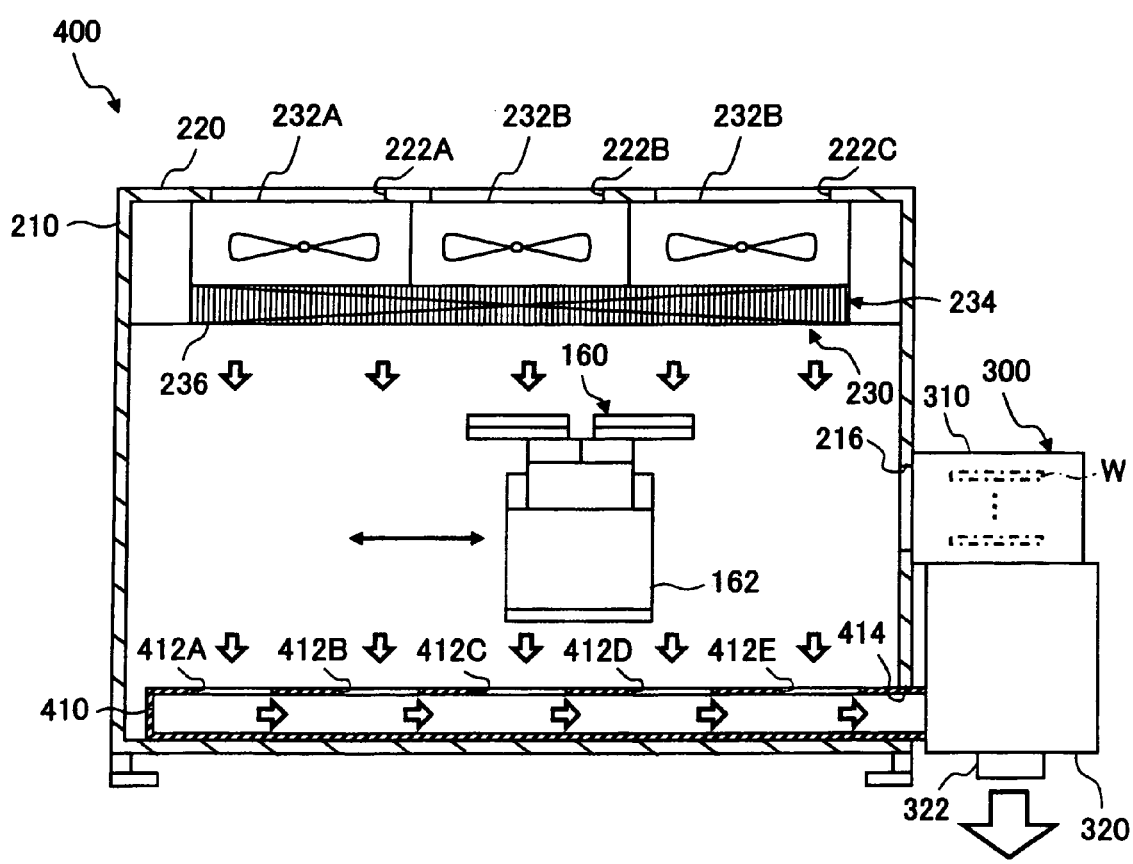
FIG. 7 presents a structural example of a transfer chamber from which a discharge gas is released via an acid discharge unit.

Accordingly, a structural example that may be adopted in a transfer chamber from which the discharge gas is discharged through the acid discharge unit representing an example to be compared with the present invention, is explained in detail. FIG. 7 presents a structural example that may be adopted to discharge the discharge gas in the transfer chamber 200 shown in FIG. 5 by utilizing the acid discharge unit 300. A transfer chamber 400 in FIG. 7 differs from the transfer chamber 200 in FIG. 5, which includes the discharge unit 250 disposed thereat, in that a discharge pipe 410 with a substantially angular section is disposed at the bottom 240 of the casing 210 with one of the ends of the discharge pipe 410 formed as an opening end connected to the acid discharge unit 320 of the acid discharge unit 300.

Unlike the transfer chamber 200 in FIG. 5 with the discharge ports 242 (242A through 242E) formed at the bottom 240 of the casing 210, discharge ports 412 (412A through 412E) are disposed above the discharge pipe 410 in the transfer chamber 400 shown in FIG. 7 so as to guide the air inside the transfer chamber 400 via the discharge pipe 410 to the acid discharge unit 320 in the acid discharge unit 300 through the discharge ports 412 (412A through 412E).

In the transfer chamber 400 structured as described above, a negative pressure is generated through the discharge ports 412 (412A through 412E) at the discharge pipe 410 via the acid discharge unit 320, due to the discharge suction force imparted from the plant discharge system connected to the discharge pipe 322 at the acid discharge unit 320 in the acid discharge unit 300. Thus, the air inside the transfer chamber 400 is taken in through the discharge ports 412 (412A through 412E), travels through the discharge pipe 410 and is released into the plant discharge system via the acid discharge unit 320. In other words, even if the discharge gas from the transfer chamber 400 contains a harmful constituent, the harmful constituent is not released into the clean room.

However, the displacement from the transfer chamber 400 is far greater than the displacement from the acid discharge unit 320 of the acid discharge unit 300 and, for this reason, if the entire displacement from the transfer chamber 400 is directed into the plant discharge system, as shown in FIG. 7, a great onus is placed on the plant discharge system. While the displacement from the transfer chamber varies in correspondence to the processing capability of the substrate processing apparatus, the displacement from the transfer chamber 400 may be as much as 11.5 m$^3$/min, almost 6 times the hypothetical displacement of 2 m$^3$/min from the acid discharge unit 320 in the acid discharge unit 300. In other words, if the entire discharge (e.g., 13.5 m$^3$/min) is to be processed in the plant discharge system, a very large onus is placed on the plant discharge system.

In contrast, the discharge gas from the transfer chamber 200 achieved in the embodiment shown in FIG. 5, is directly discharged through the discharge ports 242 (242A through 242E) formed at the bottom 240 thereof, which greatly reduces the onus placed on the plant discharge system. Since the discharge gas (with a displacement of, for instance, 11.5 m$^3$/min) from the transfer chamber 200 can be directly released from the transfer chamber 200, the onus placed on the plant discharge system, which only needs to process the discharge gas (with a displacement of 2 m$^3$/min) from the acid discharge unit 320 in the acid discharge unit 300, is greatly reduced.

In addition, since the discharge unit 250 that includes the discharge gas filtering means 254 for eliminating the harmful constituent in the discharge gas is disposed at the bottom 240 of the casing 210 in the transfer chamber 400 shown in FIG. 5, any harmful constituent such as a corrosive constituent originating from the processing gas having settled on the processed wafer W and contained in the discharge gas from the transfer chamber 200 is eliminated through the discharge gas filtering means 254. As a result, only clean air is released from the transfer chamber 200. This means that even if the discharge gas is directly released from the transfer chamber 200 to, for instance, the clean room, the discharge gas from the transfer chamber 200 no longer contains a harmful constituent such as a corrosive constituent and thus the equipment installed inside the clean room does not become corroded.

In addition, the discharge gas from the transfer chamber 200 achieved in the embodiment can be discharged without having to utilize the acid discharge unit 300 as described above. This means that the present invention may be adopted in a substrate processing apparatus 100 that is not equipped with an acid discharge unit 300.

Furthermore, the acid discharge unit 320 in the acid discharge unit 300 may include a discharge fan and a discharge gas filter such as those in the discharge unit 250 in the embodiment so as to release the discharge gas from the acid discharge unit 320 via the discharge gas filter. In such a case, any harmful constituent such as a halogen base constituent contained in the discharge gas from the acid discharge unit 320 can be eliminated through the discharge gas filter and, as a result, the discharge gas from the acid discharge unit can be directly released into, for instance, the clean room without connecting the discharge pipe 322 at the acid discharge unit 320 to the plant discharge system. Consequently, the onus placed on the plant discharge system can be further reduced.

The discharge gas filter included in this structure may be disposed at the acid discharge unit 320 at a position near the area where the acid discharge unit 320 is connected with, for instance, the substrate standby chamber 310. Since air is allowed to enter the acid discharge unit 320 only after a harmful constituent is eliminated through the discharge gas filters in this structure, no anti-corrosion measures need to be taken inside the acid discharge unit 320. In other words, parts such as the pressure difference sensor and a variable valve installed inside the acid discharge unit 320 do not need to be high-end constituents.

It is to be noted that while an explanation is given above in reference to the embodiment on an example in which the discharge gas filtering means 254 is disposed at the discharge unit 250 and the intake air filtering means 234 is disposed at the air intake unit 230, the present invention is not limited to this example and it may include only the discharge gas filtering means 254 disposed at the discharge unit 250. As long as the discharge gas filtering means 254 is included in the discharge unit 250, air containing a harmful gas constituent originating from, for instance, a halogen-base gas having settled on the processed wafer W is not discharged.

However, by providing the intake air filtering means 234 at the air intake unit 230, generation of particles attributable to, for instance, the presence of an ammonia constituent on the processed wafer W, with a constituent of the gas having settled thereupon, is prevented. By utilizing the air intake air filtering means 234 in combination with the discharge gas filtering means 254, fully effective measures can be taken with regard to the gas that may settle on the processed wafer W.

(Another Structural Example for Substrate Processing Apparatus)

Figure 8:
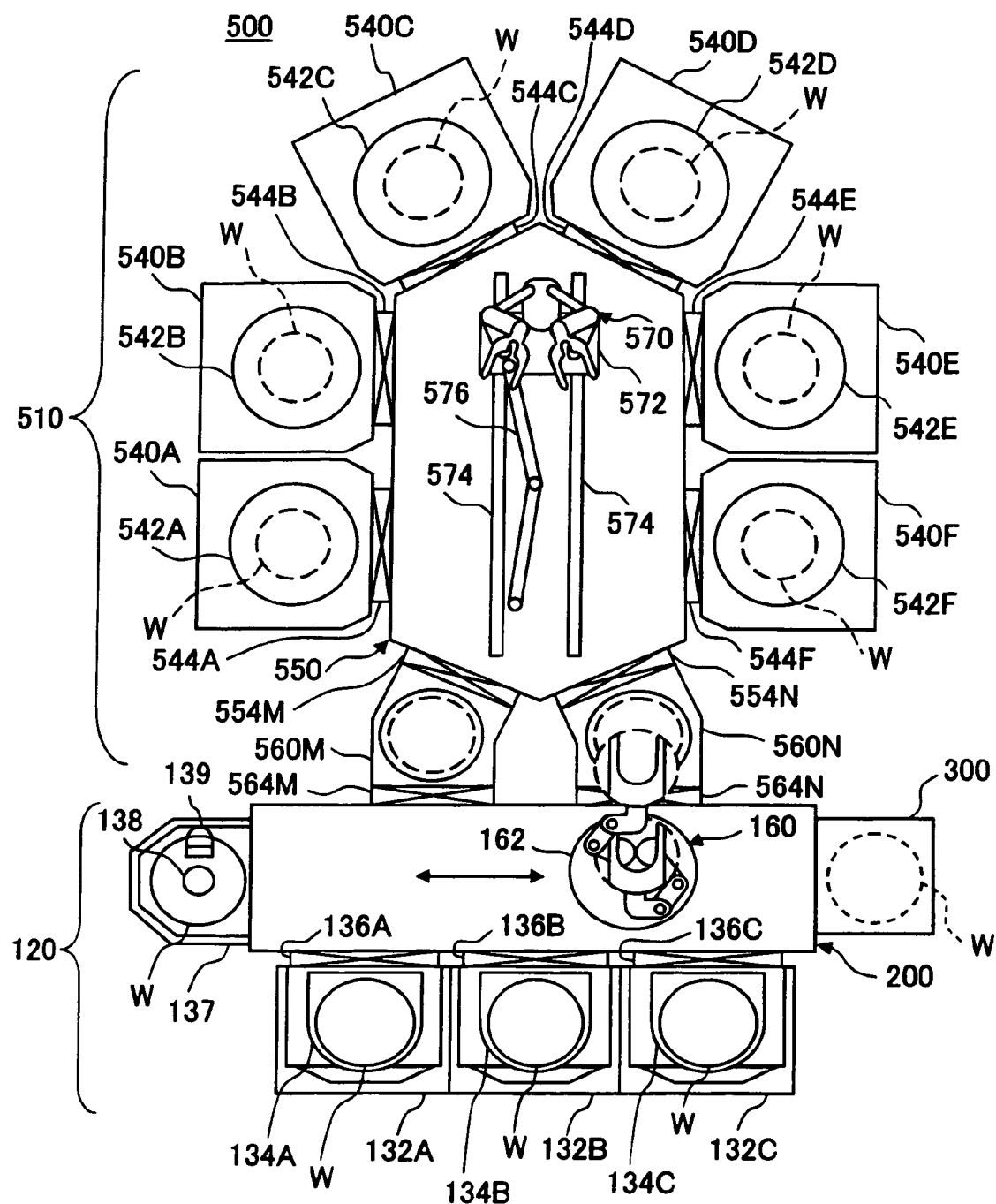
FIG. 8 is a sectional view presenting another structural example that may be adopted in the substrate processing apparatus in an embodiment of the present invention.

Next, another structural example that may be adopted in the substrate processing apparatus in an embodiment of the present invention is explained in reference to a drawing. The present invention may be adopted in various other substrate processing apparatuses as well as in the substrate processing apparatus 100 shown in FIG. 1. FIG. 8 schematically illustrates the structure of a substrate processing apparatus that includes a multichamber vacuum processing unit.

The substrate processing apparatus 500 in FIG. 8 includes a vacuum processing unit 510 with a plurality of processing chambers 540 where substrates such as wafers W undergo various types of processing such as film formation and etching and a transfer unit 120 that carries wafers W into/out of the vacuum processing unit 510. Since the transfer unit 120 adopts a structure substantially identical to that shown in FIG. 1, the same reference numerals are assigned to constituents thereof with substantially identical functions and structural features to preclude the necessity for a repeated explanation thereof.

A common transfer mechanism (atmospheric pressure-side transfer mechanism) 160 disposed inside the transfer chamber 200 at the transfer unit 120 in FIG. 8 adopts a single arm structure that includes a single end-effector. A base 162 at which the common transfer mechanism 160 is locked is slidably supported on a guide rail (not shown) extending over the central area inside the transfer chamber 200 along the lengthwise direction. A mover and a stator of a linear motor are respectively disposed at the base 162 and the guide rail. A linear motor drive mechanism (not shown) used to drive the linear motor is disposed at an end of the guide rail. The control unit (not shown) is connected to the linear motor drive mechanism. Thus, the linear motor drive mechanism is driven in response to a control signal provided by the control unit to move the common transfer mechanism 160 along the direction indicated by the arrow together with the base 162 on the guide rail.

FIG. 8 shows the vacuum processing unit 510 which includes, for instance, six processing chambers 540A through 540F and is disposed at a side surface of the transfer unit 120. The vacuum processing unit 510 includes a common transfer chamber 550 through which wafers are carried into/out of the six processing chambers 540A through 540F, with the processing chambers 540A through 540F disposed around the common transfer chamber 550 respectively via gate valves 544A through 544F. In addition, first and second load-lock chambers 560M and 560N, which can be evacuated, are connected respectively via gate valves 554M and 554N with the common transfer chamber 550. The first and second load-lock chambers 560M and 560N are connected at a side surface of the transfer chamber 200 respectively via gate valves 564M and 564N.

As described above, the common transfer chamber 550 is connected with the six processing chambers 540A through 540F and with the load-lock chambers 560M and 560N so as to open/close the passages between them as necessary while sustaining a high level of airtightness in a cluster-tool structure. In other words, communication with the space inside the common transfer chamber 550 is achieved as necessary. In addition, the passages between the transfer chamber 200 and the first and second load-lock chambers 560M and 560N can be opened/closed as necessary while sustaining a required level of airtightness.

A single type of processing or different types of processing can be executed on the wafers W in the processing chambers 540A through 540F. Stages 542A through 542F on which the wafers W are to be placed are respectively disposed inside the processing chambers 540A through 540F.

The load-lock chambers 560M and 560N each have a function of temporarily holding a wafer W to be transferred to the next stage after a pressure adjustment. The load-lock chambers 560M and 560N may include a cooling mechanism or a heating mechanism.

Inside the common transfer chamber 550, a transfer mechanism (vacuum pressure-side transfer mechanism) 570 constituted with an articulated arm capable of articulating, moving up/down and rotating, for instance, is disposed. The transfer mechanism 570 is rotatably supported at a base 572. The base 572 is allowed to slide freely over guide rails 574 extending from the base end side toward the front end side inside the common transfer chamber 550 via, for instance, an arm mechanism 576.

The load-lock chambers 560M and 560N and the processing chambers 540A through 540F can be accessed by the transfer mechanism 570 as it slides along the guide rails 574. For instance, to access the load-lock chamber 560M or 560N or either of the processing chambers 540A and 540F located at positions facing opposite each other, the transfer mechanism 570 is positioned on the guide rails 574 toward the base end of the common transfer chamber 550.

To access any of the four processing chambers 540B through 540E, the transfer mechanism 570 is positioned on the guide rails 574 toward the front end of the common transfer chamber 550. Thus, all the chambers connected to the common transfer chamber 550, i.e., the load-lock chambers 560M and 560N and the individual processing chambers 540A through 540F, can be accessed by the single transfer mechanism 570. The transfer mechanism 570 includes two end-effectors and thus is capable of handling two wafers W at a time.

It is to be noted that the transfer mechanism 570 may adopt a structure other than that described above, and may include, for instance, two transfer mechanisms. Namely, a first transfer mechanism constituted with an articulated arm capable of articulating, moving up/down and rotating may be disposed toward the base end of the common transfer chamber 550 and a second transfer mechanism constituted with an articulated arm capable of articulating, moving up/down and rotating may be disposed toward the front end of the common transfer chamber 550. In addition, the number of end-effectors at the transfer mechanism 570 does not need to be two, and the transfer mechanism 570 may include, for instance, a single end-effector, instead.

The structure shown in FIG. 5 may be adopted in the transfer chamber 200 in the substrate processing apparatus 500 in FIG. 8 as well. The substrate processing apparatus 500 in FIG. 8, adopting the structure in FIG. 5, too, achieves advantages similar to those of the substrate processing apparatus 100 in FIG. 1.

It is to be noted that the number of processing chambers 540 in the substrate processing apparatus 500 does not need to be six as shown in FIG. 8 and the substrate processing apparatus may include five or fewer processing chambers or it may include a greater number of processing chambers. In addition, while the substrate processing apparatus in FIG. 8 includes a single vacuum processing unit 510 constituted with a plurality of processing chambers connected around a single common transfer chamber 550, the present invention may be adopted in a substrate processing apparatus with a structure other than this. For instance, it may be adopted in a so-called tandem type substrate processing apparatus which includes two or more processing chamber units each made up with a plurality of processing chambers, connected around a single common transfer chamber 550 via buffer chambers.

While the invention has been particularly shown and described with respect to preferred embodiments thereof by referring to the attached drawings, the present invention is not limited to these examples and it will be understood by those skilled in the art that various changes in form and detail may be made therein without departing from the spirit, scope and teaching of the invention.

For instance, an explanation is given above in reference to the embodiments on an example in which the discharge unit that includes discharge gas filters for eliminating a harmful gas constituent such as a halogen-base gas constituent contained in a corrosive gas or the like is disposed at a transfer chamber of a substrate processing apparatus, the present invention is not limited to this example, and it may instead be adopted in a loadlock chamber (e.g., the loadlock chamber 150A or 150B in FIG. 1 or the loadlock chamber 560M or 560N in FIG. 8) of a substrate processing apparatus.

A loadlock chamber in a substrate processing apparatus may include an acid discharge unit that executes an acid discharge in the loadlock chamber, provided as a unit independent of an evacuation unit connected to a vacuum pump or the like to evacuate the loadlock chamber. The acid discharge pipe of such an acid discharge unit is connected to the plant discharge system. A gas constituent (e.g., a halogen-base gas constituent such as HCl or HBr) of the processing gas having settled on a processed wafer and entered the loadlock chamber together with the processed wafer is discharged (acid discharge) with specific timing by controlling the valve of the discharge pipe. Accordingly, by disposing a discharge unit that includes a discharge gas filter and a discharge fan at the acid discharge pipe in the loadlock chamber, a harmful constituent such as a corrosive gas constituent can be eliminated from the discharge gas discharged via the acid discharge pipe of the loadlock chamber. In such a case, the discharge gas can be directly released without having to connect the acid discharge pipe of the loadlock chamber to the plant discharge system and, as a result, the onus placed on the plant discharge system can be reduced.

In addition, while an explanation is given above in reference to the embodiment on an example in which the air intake unit that includes intake filters for eliminating an amine constituent such as ammonia is disposed at the transfer chamber of the substrate processing apparatus, the present invention is not limited to this example and such an air intake unit may be installed in a loadlock chamber of a substrate processing apparatus.

At a loadlock chamber in a substrate processing apparatus, a communicating port that comes into communication with the external air (e.g., the atmosphere in the clean room) for purposes of adjusting the internal pressure to one atmosphere is disposed. This means that the air containing an amine constituent such as ammonia may enter the loadlock chamber through the communication port, which gives rise to a concern that ammonia having entered the loadlock chamber may undergo a reaction with the processing gas constituent having settled on the processed wafer in the loadlock chamber to generate particles on the processed wafer. Accordingly, an air intake unit that includes an intake air filter for eliminating an amine constituent such as ammonia may be disposed at the communication port at the loadlock chamber so as to eliminate the amine constituent from the air drawn into the loadlock chamber via the communication port and thus prevent generation of particles originating from the gas constituent having settled on the processed wafer.

Moreover, the present invention may be adopted in any of various types of substrate processing apparatuses other than the substrate processing apparatus explained in reference to the embodiment. For instance, the present invention may be adopted in a vertically oriented heat treatment apparatus or a coating developer apparatus.

What is claimed is:

1. A substrate processing apparatus, comprising:
   a processing unit in which a specific type of processing is executed on a substrate; and
   a transfer unit through which the substrate is carried into/out of said processing unit, wherein said transfer unit includes:
   a transfer chamber that is used when the substrate is carried into/out of said processing unit;
   a transfer mechanism disposed in the transfer chamber, that transfers the substrate;
   a plurality of air intake fans disposed at an upper space inside said transfer chamber, that draws external air into said transfer chamber through a plurality of air intake ports;
   at least one air intake filter unit disposed below said air intake fans so as to cover said air intake fans, the at least one air intake filter unit constituting an amine component eliminating filter through which the external air is drawn into said transfer chamber through said air intake ports to first eliminate at least an amine component contained in the external air;
   a discharge unit disposed below said transfer chamber so as to face opposite said plurality of air intake fans and having a plurality of discharge ports through which an atmosphere within said transfer chamber is discharged;
   at least one discharge gas filter unit disposed within the transfer chamber so as to cover said plurality of discharge ports and to face opposite the at least one air intake filter unit, the at least one discharge gas filter unit constituting a harmful constituent eliminating filter through which a discharge gas is discharged to a space outside said transfer chamber through said plurality of discharge ports to first eliminate at least a harmful constituent present in the discharge gas; and
   a plurality of discharge fans each mounted at one of said discharge ports at said transfer chamber so as to face opposite the plurality of air intake fans and creating a down flow that is a discharge flow within said transfer chamber directed from said plurality of air intake fans toward said discharge unit,
   said at least one discharge gas filter unit has a plurality of wave-like constituents disposed such that a side surface of each individual constituent is along a direction of said down flow and disposed separately from said plurality of discharge fans,
   said at least one discharge gas filter unit eliminates the harmful constituent as the discharge gas passes through among said plurality of wave-like constituents, and
   the plurality of discharge fans face opposite the plurality of air intake fans so that the discharge flow flowing, between the at least one air intake filter unit and the at least one discharge gas filter unit, from the plurality of air intake fans toward the discharge unit is adjusted to achieve linearity to prevent particles from being lifted upward.

2. A substrate processing apparatus according to claim 1, wherein
said at least one air intake filter unit includes
a particle eliminating filter that eliminates particles contained in the external air drawn into said transfer chamber in addition to the amine constituent eliminating filter through which at least the amine constituent present in the external air drawn into said transfer chamber is eliminated.

3. A substrate processing apparatus according to claim 1, further comprising:
a standby unit connected to said transfer chamber and constituted with a substrate standby chamber where a substrate having undergone processing in said processing unit is temporarily held in standby and an acid discharge unit that executes an acid discharge in said substrate standby chamber; and
a discharge gas filter disposed at said acid discharge unit of said standby unit that filters acid discharge gas.

4. A substrate processing apparatus according to claim 3, wherein:
the discharge gas filter disposed at said acid discharge unit includes a harmful constituent eliminating filter through which a harmful constituent in the discharge gas, at least, is eliminated.

5. A substrate processing apparatus according to claim 4, wherein:
a positioning device that positions the substrate is connected to said transfer chamber; and
said standby unit is disposed directly under said positioning device.

6. A substrate processing apparatus according to claim 1, wherein:
said plurality of wave-like constituents of said harmful constituent eliminating filter achieves a honeycomb form and the harmful constituent adheres to side surfaces of said wave-like constituents and is thus eliminated as the discharge gas passes through said structural members.

7. A substrate processing apparatus according to claim 1, further comprising:
a service life sensor that detects an end of service life of said harmful constituent eliminating filter; and
a control unit that monitors said service life sensor and displays at a display unit a message that said harmful constituent eliminating filter needs to be replaced upon detecting, via said service life sensor, an end of service life of said harmful constituent eliminating filter.

8. A substrate processing apparatus according to claim 7, wherein:
said service life sensor detects a quantity of the harmful constituent present in the atmosphere within said transfer chamber.

9. A substrate processing apparatus according to claim 1, wherein:
a service life sensor constituted with a detection sheet that changes color in correspondence to the quantity of the harmful constituent is fixed onto said harmful constituent eliminating filter.

10. A substrate processing apparatus according to claim 1, wherein:
said at least one discharge gas filter unit is disposed at a lower space inside said transfer chamber.

11. A substrate processing apparatus according to claim 1, wherein:
the transfer mechanism transfers the substrate along a length of the transfer chamber, and
the at least one air intake filter unit is disposed above the transfer mechanism and the at least one discharge gas filter unit is disposed below the transfer mechanism.

12. A substrate processing apparatus according to claim 11, wherein:
the transfer mechanism is fixed onto a base which is disposed over a central area of the transfer chamber.

13. A substrate processing apparatus according to claim 1, wherein the at least one discharge gas filter includes a frame member and the harmful constituent eliminating filter is detachably held by a frame member with an open space formed under the discharge gas filter.

14. A transfer unit for substrate processing comprising:
a transfer chamber that is used when a substrate is carried into/out of a processing unit;
a transfer mechanism disposed in the transfer chamber, that transfers the substrate;
a plurality of air intake fans disposed at an upper space inside said transfer chamber, that draws external air into said transfer chamber through a plurality of air intake ports;
at least one air intake filter unit disposed below said air intake fans so as to cover said air intake fans, the at least one air intake filter unit constituting an amine component eliminating filter through which the external air is drawn into said transfer chamber through said air intake ports to first eliminate at least an amine component contained in the external air;
a discharge unit disposed below said transfer chamber so as to face opposite said plurality of air intake fans and having a plurality of discharge ports through which an atmosphere within said transfer chamber is discharged;
at least one discharge gas filter unit disposed within the transfer chamber so as to cover said plurality of discharge ports and to face opposite the at least one air intake filter unit, the at least one discharge gas filter unit constituting a harmful constituent eliminating filter through which a discharge gas is discharged to a space outside said transfer chamber through said plurality of discharge ports to first eliminate at least a harmful constituent present in the discharge gas; and
a plurality of discharge fans each mounted at one of said discharge ports at said transfer chamber so as to face opposite the plurality of air intake fans and creating a down flow that is a discharge flow within said transfer chamber directed from said plurality of air intake fans toward said discharge unit, wherein
said at least one discharge gas filter unit has a plurality of wave-like constituents disposed such that a side surface of each individual constituent is along a direction of said down flow and disposed separately from said plurality of discharge fans,
said at least one discharge gas filter unit eliminates the harmful constituent as the discharge gas passes through among said plurality of wave-like constituents, and
the plurality of discharge fans face opposite the plurality of air intake fans so that the discharge flow flowing, between the at least one air intake filter unit and the at least one discharge gas filter unit, from the plurality of air intake fans toward the discharge unit is adjusted to achieve linearity to prevent particles from being lifted upward.

15. A substrate processing apparatus comprising:
a processing unit in which a specific type of processing is executed on a substrate; and
a transfer unit through which the substrate is carried into/out of said processing unit, wherein said transfer unit includes:
  a transfer chamber that is used when the substrate is carried into/out of said processing unit;
  a transfer mechanism disposed in the transfer chamber, that transfers the substrate;
  a plurality of air intake fans disposed at an upper space inside said transfer chamber, that draws external air into said transfer chamber through a plurality of air intake ports;
  at least one air intake filter unit disposed below said plurality of air intake fans so as to cover said plurality of air intake fans, the at least one air intake filter unit through which the external air is drawn into said transfer chamber through said air intake ports to filter the external air and to eliminate an impurity component contained in the external air;
  a discharge unit disposed below said transfer chamber so as to face opposite said plurality of air intake fans and having a plurality of discharge ports through which an atmosphere within said transfer chamber is discharged;
  at least one discharge gas filter unit disposed within the transfer chamber so as to cover said plurality of discharge ports and to face opposite the at least one air intake filter unit, the at least one discharge gas filter unit constituting a corrosive gas constituent eliminating filter through which a discharge gas is discharged to a space outside said transfer chamber through said plurality of discharge ports to eliminate at least a corrosive gas constituent present in the discharge gas; and
  a plurality of discharge fans each mounted at one of said discharge ports at said transfer chamber so as to face opposite the plurality of air intake fans and creating a down flow that is a discharge flow within said transfer chamber directed from said plurality of air intake fans toward said discharge unit,
  said at least one discharge gas filter unit has a plurality of wave-like constituents disposed such that a side surface of each individual constituent is along a direction of said down flow and disposed separately from said plurality of discharge fans,
  said at least one discharge gas filter unit eliminates the corrosive gas constituent as the discharge gas passes through among said plurality of wave-like constituents, and
  the plurality of discharge fans face opposite the plurality of air intake fans so that the discharge flow flowing, between the at least one air intake filter unit and the at least one discharge gas filter unit, from the plurality of air intake fans toward the discharge unit is adjusted to achieve linearity to prevent particles from being lifted upward.

16. A substrate processing apparatus according to claim 15, wherein a processing gas constituent of a corrosive gas is settled on the substrate.

17. A substrate processing apparatus according to claim 16, wherein the corrosive gas is a halogen-base gas.

18. A substrate processing apparatus according to claim 15, wherein the impurity component is an amine component.

19. A transfer unit for substrate processing comprising:
  a transfer chamber that is used when the substrate is carried into/out of said processing unit;
  a transfer mechanism disposed in the transfer chamber, that transfers the substrate;
  a plurality of air intake fans disposed at an upper space inside said transfer chamber, that draws external air into said transfer chamber through a plurality of air intake ports;
  at least one air intake filter unit disposed below said plurality of air intake fans so as to cover said plurality of air intake fans, the at least one air intake filter unit through which the external air is drawn into said transfer chamber through said air intake ports to filter the external air and to eliminate an impurity component contained in the external air;
  a discharge unit disposed below said transfer chamber so as to face opposite said plurality of air intake fans and having a plurality of discharge ports through which an atmosphere within said transfer chamber is discharged;
  at least one discharge gas filter unit disposed within the transfer chamber so as to cover said plurality of discharge ports and to face opposite the at least one air intake filter unit, the at least one discharge gas filter unit constituting a corrosive gas constituent eliminating filter through which a discharge gas is discharged to a space outside said transfer chamber through said plurality of discharge ports to eliminate at least a corrosive gas constituent present in the discharge gas; and
  a plurality of discharge fans each mounted at one of said discharge ports at said transfer chamber so as to face opposite the plurality of air intake fans and creating a down flow that is a discharge flow within said transfer chamber directed from said plurality of air intake fans toward said discharge unit,
  said at least one discharge gas filter unit has a plurality of wave-like constituents disposed such that a side surface of each individual constituent is along a direction of said down flow and disposed separately from said plurality of discharge fans,
  said at least one discharge gas filter unit eliminates the corrosive gas constituent as the discharge gas passes through among said plurality of wave-like constituents, and
  the plurality of discharge fans face opposite the plurality of air intake fans so that the discharge flow flowing, between the at least one air intake filter unit and the at least one discharge gas filter unit, from the plurality of air intake fans toward the discharge unit is adjusted to achieve linearity to prevent particles from being lifted upward.

20. A transfer unit according to claim 19, wherein a processing gas constituent of a corrosive gas is settled on the substrate.

21. A substrate processing apparatus according to claim 20, wherein the corrosive gas is a halogen-base gas.

22. A substrate processing apparatus according to claim 19, wherein the impurity component is an amine component.

* * * * *

UNITED STATES PATENT AND TRADEMARK OFFICE
CERTIFICATE OF CORRECTION

PATENT NO. : 8,353,986 B2
APPLICATION NO. : 11/391390
DATED : January 15, 2013
INVENTOR(S) : Yoshiaki Sasaki et al.

It is certified that error appears in the above-identified patent and that said Letters Patent is hereby corrected as shown below:

On the title page, Item (75), the 1st Inventor's Last Name is incorrect. Item (75) should read:

--(75) Inventors:  Yoshiaki Sasaki, Nirasaki (JP); Yusuke Muraki, Nirasaki (JP); Eiichi Nishimura, Nirasaki (JP); Yuko Ono, Nirasaki (JP)--

Signed and Sealed this
Ninth Day of April, 2013

Teresa Stanek Rea
*Acting Director of the United States Patent and Trademark Office*